United States Patent
Rajavel et al.

(10) Patent No.: US 9,207,120 B2
(45) Date of Patent: Dec. 8, 2015

(54) SYSTEMS AND METHODS FOR DETECTING MULTIPLE INFRARED BANDS

(71) Applicant: The Boeing Company, Seal Beach, CA (US)

(72) Inventors: Rajesh D. Rajavel, Oak Park, CA (US); Terence J. deLyon, Newbury Park, CA (US)

(73) Assignee: The Boeing Company, Chicago, IL (US)

( * ) Notice: Subject to any disclaimer, the term of this patent is extended or adjusted under 35 U.S.C. 154(b) by 155 days.

(21) Appl. No.: 13/941,979

(22) Filed: Jul. 15, 2013

(65) Prior Publication Data
US 2015/0014537 A1   Jan. 15, 2015

(51) Int. Cl.
| | |
|---|---|
| *G01J 5/02* | (2006.01) |
| *G01J 3/36* | (2006.01) |
| *G01J 5/10* | (2006.01) |
| *H01L 31/02* | (2006.01) |
| *G01J 5/28* | (2006.01) |
| *G01J 3/28* | (2006.01) |

(52) U.S. Cl.
CPC .... *G01J 3/36* (2013.01); *G01J 5/10* (2013.01); *G01J 5/28* (2013.01); *H01L 31/02016* (2013.01); *G01J 2003/2826* (2013.01)

(58) Field of Classification Search
CPC ......... G01J 5/10; G01J 3/36; H01L 31/02016
USPC .................. 250/339.01; 257/15, 18
See application file for complete search history.

(56) References Cited

U.S. PATENT DOCUMENTS

| | | | |
|---|---|---|---|
| 8,847,202 B1 * | 9/2014 | Nosho et al. | 257/15 |
| 2011/0037097 A1 * | 2/2011 | Scott et al. | 257/184 |

OTHER PUBLICATIONS

Borca-Tasciuc et al. "Thermal conductivity of AlAs0.07Sb0.93 and Al0.9Ga0.1As0.07Sb0.93 alloys and (Al/As)1/(Al/sb)11 digital alloys" Journal of Applied Physics, vol. 92, No. 6, Nov. 1, 2002, pp. 4994-4998.*

Maimon et al., "nBn detector, an infrared detector with reduced dark current and higher operating temperature", Applied Physics Letters, 2006, vol. 89.

Khoshakhlagh et al., "Bias dependent dual band response from InAs/Ga(In)Sb type II strain layer superlattice detectors", Applied Physics Letters, 2007, vol. 91.

Lee et al., "Subband transitions in dual-band n-B-n. InAs/GaSb superlattice infrared photodetector identified by photoresponse spectra", Applied Physics Letters, 2009, vol. 95.

* cited by examiner

*Primary Examiner* — David Porta
*Assistant Examiner* — Meenakshi Sahu
(74) *Attorney, Agent, or Firm* — Armstrong Teasdale LLP

(57) ABSTRACT

A dual-band infrared detector is provided. The dual-band infrared detector includes a first absorption layer, a barrier layer coupled to the first absorption layer, and a second absorption layer coupled to the barrier layer. The first absorption layer is sensitive to only a first infrared wavelength band and the second absorption layer is sensitive to only a second infrared wavelength band that is different from the first infrared wavelength band. The dual-band infrared detector is capable of detecting the first wavelength band and the second wavelength band by applying a first bias voltage of a first polarity to the first absorption layer and by applying a second bias voltage of a second polarity that is opposite the first polarity to the second absorption layer, wherein the first bias voltage and the second bias voltage each have a magnitude of less than about 500 mV.

20 Claims, 6 Drawing Sheets

SYSTEMS AND METHODS FOR DETECTING MULTIPLE INFRARED BANDS

BACKGROUND

The present disclosure relates generally to infrared detection, and more particularly to systems for use in detecting multiple infrared bands using a barrier-type detector.

At least some known infrared detectors include a barrier layer that is coupled to a single absorption layer that generates an electrical current after receiving infrared radiation in a predetermined wavelength band. In such detectors, the barrier layer is fabricated from a uniform material that is aligned with valence band energy levels of the single absorption layer. Accordingly, the uniform barrier layer is not suitable for concurrent use with a second absorption layer that is sensitive to a different wavelength band if the valence band edge of the second absorbing layer is not naturally aligned with that of the first absorbing layer.

The response of an infrared detector is a function of an operating bias voltage that is applied to the device structure. Misalignments in valence band energy levels of a barrier layer and an absorption layer can be remedied, to an extent, by adjusting a magnitude of a bias voltage applied to the device structure. However, applying a bias voltage beyond about 500 millivolts (mV) may create an increase in dark current that reduces performance of the detector and reduces the ability of the infrared detector to accurately detect infrared radiation. As such the use of infrared detectors may be limited.

Achieving proper alignment of the valence band energy levels of barrier layers and multiple absorbing layers in a detector structure designed for detection of infrared radiation in multiple spectral bands is highly desirable.

BRIEF DESCRIPTION

In one aspect, a dual-band infrared detector is provided. The dual-band infrared detector includes a first absorption layer, a barrier layer coupled to the first absorption layer, and a second absorption layer coupled to the barrier layer. The first absorption layer is sensitive to only a first infrared wavelength band and the second absorption layer is sensitive to only a second infrared wavelength band that is different from the first infrared wavelength band. The dual-band infrared detector is capable of detecting the first wavelength band and the second wavelength band by applying a first bias voltage of a first polarity to the first absorption layer and by applying a second bias voltage of a second polarity that is opposite the first polarity to the second absorption layer, wherein the first bias voltage and the second bias voltage each have a magnitude of less than about 500 mV.

In another aspect, an imaging system is provided. The imaging system includes a computing device and a dual-band infrared detector that is communicatively coupled to the computing device. The dual-band infrared detector includes a first absorption layer, wherein the first absorption layer includes a first valence band edge and is sensitive to only a first infrared wavelength band. The dual-band infrared detector also includes a second absorption layer, wherein the second absorption layer includes a second valence band edge and is sensitive to only a second infrared wavelength band that is different from the first infrared wavelength band. The dual-band infrared detector additionally includes a barrier layer that includes a first section that is coupled to the first absorption layer, wherein the first section is aligned with the first valence band edge of the first absorption layer. The barrier layer also includes a second section that is coupled to the second absorption layer, wherein the second section is aligned with the second valence band edge of the second absorption layer. The barrier layer also includes a gradient between the first section and the second section. The dual-band infrared detector also includes an interface layer coupled to one of the first absorption layer and the second absorption layer, and a readout chip that is coupled to the interface layer and electrically coupled to the first absorption layer and the second absorption layer.

In another aspect, a method for detecting two bands of infrared radiation using a dual-band infrared detector is provided. The dual-band infrared detector includes a first absorption layer, wherein the first absorption layer is sensitive to only a first infrared wavelength band, a barrier layer coupled to the first absorption layer, a second absorption layer coupled to the barrier layer, wherein the second absorption layer is sensitive to only a second infrared wavelength band that is different from the first infrared wavelength band, an interface layer coupled to one of the first absorption layer and the second absorption layer, and a readout chip coupled to the interface layer and electrically coupled to the first absorption layer and the second absorption layer. The method includes applying a first bias voltage to the first absorption layer, wherein the first bias voltage has a first magnitude and a first polarity, receiving a first electrical signal from the first absorption layer corresponding to detection of infrared radiation in the first wavelength band, applying a second bias voltage to the second absorption layer, wherein the second bias voltage has a second magnitude that is substantially equal to the first magnitude and a second polarity that is opposite the first polarity, and receiving a second electrical signal from the second absorption layer corresponding to detection of infrared radiation in the second wavelength band.

DETAILED DESCRIPTION

Figure 1:
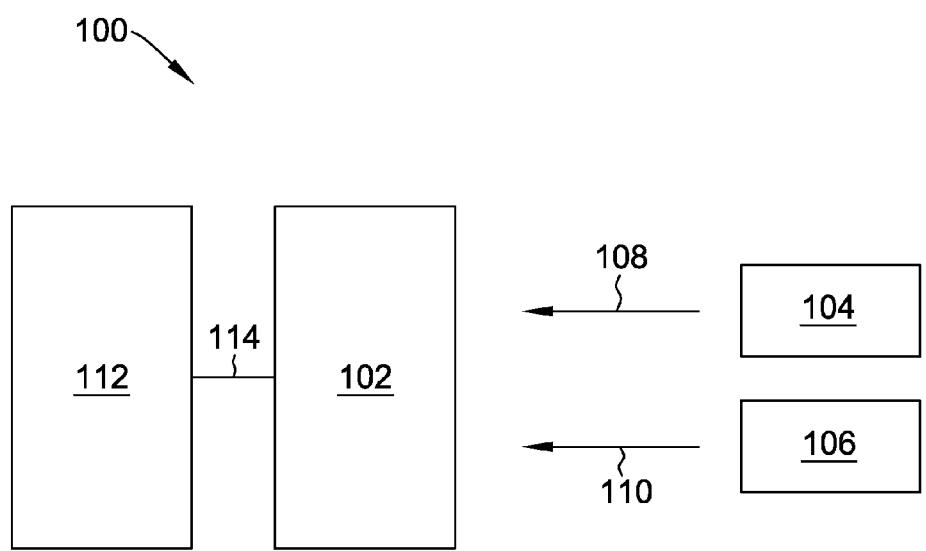
FIG. 1 is a block diagram of an example environment in which a dual-band infrared detector may be used.

FIG. 1 is a block diagram of an example environment 100 in which a dual-band infrared detector 102 may be used. Dual-band infrared detector 102 is capable of detecting first infrared radiation 108 emitted from a first object 104 in a first wavelength band, and detecting second infrared radiation 110 emitted from a second object 106 in a second wavelength band. First object 104 may be, for example, an aircraft and second object 106 may be, for example, a munition such as a missile. In other implementations, first object 104 and second object 106 are a single object rather than separate objects. The second wavelength band is different than the first wavelength band. For example, first wavelength band corresponds to mid-wavelength infrared radiation (MWIR), having wavelengths between 3-5 micrometers, while second wavelength band corresponds to long-wavelength infrared radiation (LWIR), having wavelengths between 8-15 micrometers. In other implementations, at least one of the first wavelength band and the second wavelength band corresponds to a different range of wavelengths. For example, first wavelength band or second wavelength band may correspond to short-wavelength infrared radiation (SWIR), having wavelengths between 1.4 and 3 micrometers. In some implementations, at least one of the first wavelength band and the second wavelength band corresponds to less than a full range of LWIR, MWIR, or SWIR wavelengths and/or spans one or more of LWIR, MWIR, and SWIR wavelength ranges. Additionally, in some implementations, the first wavelength band partially overlaps with the second wavelength band.

Dual-band infrared detector 102 is communicatively coupled to computing device 112 through a connection 114, which may be wired or wireless. Using connection 114, dual-band infrared detector 102 transmits infrared detection data to computing device 112 and/or receives instructions from computing device 112. Computing device 112 performs one or more functions to facilitate processing of infrared detection data, such as image processing, for example filtering and/or object recognition, and other functions such as storage and/or transmission of data to one or more additional computing devices (not shown).

Figure 2:
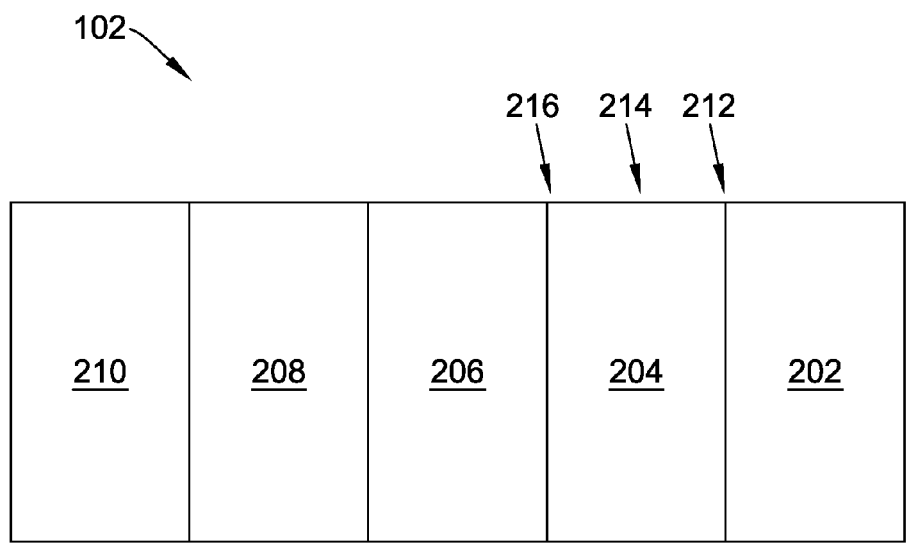
FIG. 2 is a block diagram of a dual-band infrared detector of FIG. 1.

FIG. 2 is a block diagram of dual-band infrared detector 102 of FIG. 1. Dual-band infrared detector 102 includes a first absorption layer 202, a barrier layer 204, a second absorption layer 206, an interface layer 208, and a readout chip 210. First absorption layer 202, barrier layer 204, and second absorption layer 206 are coupled together and, in some implementations, are grown in a stack through epitaxy. Interface layer 208 couples second absorption layer 206 to readout chip 210. In some implementations, dual-band infrared detector 102 includes additional layers and/or components that are not shown in FIG. 2.

First absorption layer 202 generates an electrical current upon receiving infrared radiation in a first wavelength band, thereby enabling dual-band infrared detector 102 to detect infrared radiation in the first wavelength band, as described with reference to FIG. 1. Likewise, second absorption layer 206 generates an electrical current upon receiving infrared radiation in a second wavelength band, thereby enabling dual-band infrared detector 102 to detect infrared radiation in the second wavelength band. First absorption layer 202 includes an alloy, for example an alloy of Indium (In), Arsenic (As), and Antimony (Sb) and has an associated valence band edge. In one example implementation, first absorption layer 202 comprises $InAs_{0.82}Sb_{0.18}$ and the first wavelength band corresponds to mid-wavelength infrared and includes a cutoff wavelength of 5.2 micrometers. Second absorption layer 206 also includes an alloy, for example an alloy of Indium (In), Arsenic (As), and Antimony (Sb), and has an associated valence band edge. In one example implementation, second absorption layer 206 comprises $InAs_{0.91}Sb_{0.09}$ and the second wavelength band corresponds to mid-wavelength infrared and includes a cutoff wavelength of 4.3 micrometers.

Barrier layer 204 is positioned between first absorption layer 202 and second absorption layer 206. Barrier layer 204 includes a first section 212 that is coupled to first absorption layer 202. First section 212 includes an alloy that matches the valence band edge of first absorption layer 202. Additionally, barrier layer 204 includes a second section 216 that is coupled to second absorption layer 206. Second section 216 includes an alloy that matches the valence band edge of second absorption layer 206. Barrier layer 204 additionally includes a gradient 214 in which a composition of barrier layer 204 gradually transitions from the alloy of first section 212 to the alloy of second section 216. In some implementations, barrier layer 204 includes Aluminum (Al), Antimony (Sb) and at least one of Gallium (Ga) and Arsenic (As). Accordingly, in some implementations, barrier layer 204 includes a quaternary alloy and in other implementations, barrier layer 204 includes a ternary alloy of Aluminum, Gallium, and Antimony (AlGaSb), or a ternary alloy of Aluminum, Arsenic, and Antimony (AlAsSb). As described above, the specific composition of the alloy changes gradually from first section 212 to second section 216. In an example implementation, barrier layer 204 includes an AlGaSb alloy that is graded between $X_{Ga}=0.20$ and $X_{Ga}=0.07$.

Having first section 212 that matches the valence band edge of first absorption layer 202, a second section 216 that matches the valence band edge of second absorption layer 206, and gradient 214 between first section 212 and second section 216, facilitates detecting different wavelength bands while reducing an amplitude of a bias voltage required by first absorption layer 202 and second absorption layer 206 to detect infrared radiation in the first wavelength band and the second wavelength band. More specifically, if barrier layer was instead composed of a uniform alloy that was matched to the valence band of just one of first absorption layer 202 and second absorption layer 206, an increased bias voltage would need to be applied to the other of the first absorption layer 202 and second absorption layer 206 to overcome a mismatch in valence band energy levels, thereby increasing a likelihood of generating dark currents that inhibit infrared detection.

Interface layer 208 couples second absorption layer 206 to readout chip 210. In some implementations, interface layer 208 includes a plurality of indium bumps (not shown) that are "sandwiched" together to couple second absorption layer 206 to readout chip 210. Readout chip 210 is, for example, a microchip, and includes at least a processing device and circuitry configured to apply a first bias voltage to first absorption layer 202 and a second bias voltage to second absorption layer 206 to cause first absorption layer 202 to detect infrared radiation in the first wavelength band and to cause second absorption layer 206 to detect infrared radiation in the second wavelength band. More specifically, readout chip 210 applies the first voltage to first absorption layer 202 at a first time and applies the second voltage, which has an opposite polarity, to the second absorption layer at a second time that does not overlap with the first time. For example, readout chip 210 applies a first bias voltage of +200 millivolts to first absorption layer 202 and subsequently applies a second bias voltage of −200 millivolts to second absorption layer 206. In some implementations, first absorption layer 202 and second absorption layer 206 detect infrared radiation when a bias voltage of less than 100 millivolts is applied to each of them.

Figure 3:
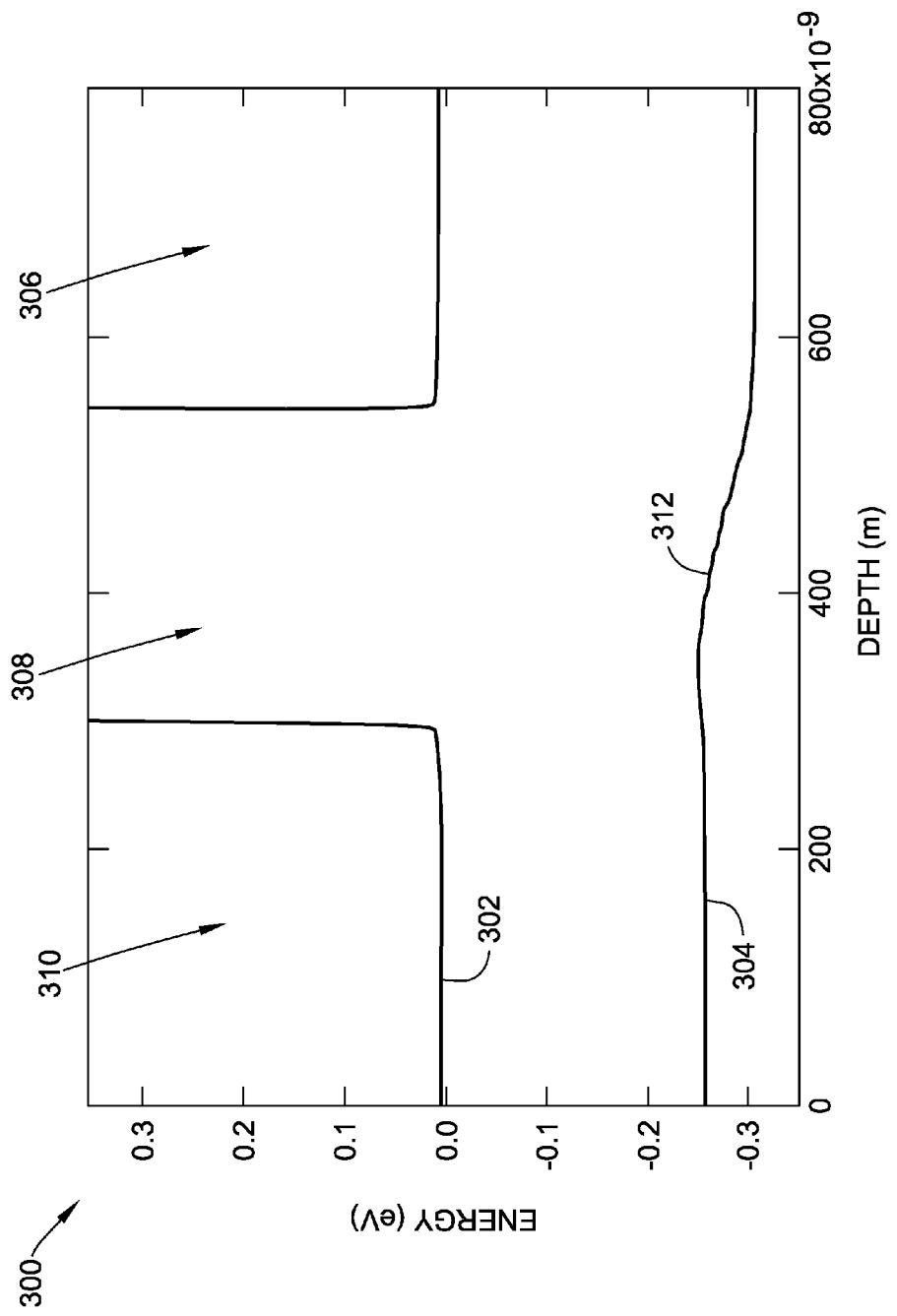
FIG. 3 is an energy diagram for the dual-band infrared detector of FIG. 1.

FIG. 3 is an energy diagram 300 for dual-band infrared detector 102 (FIG. 1). Curve 302 represents energy levels for a conduction band of dual-band infrared detector 102, and curve 304 represents energy levels for holes in the valence band of dual-band infrared detector 102. A distance between curve 302 and curve 304 determines a wavelength that dual-band infrared detector 102 (FIG. 1) is sensitive at. Accordingly, a smaller distance between curve 302 and curve 304 corresponds to lower energy and a longer wavelength, whereas a larger distance between curve 302 and curve 304 corresponds to a higher energy and a shorter wavelength of radiation. Section 306 corresponds to first absorption layer 202 (FIG. 2) and illustrates a sensitivity to radiation in a first wavelength band. Section 308 corresponds to barrier layer 204. Section 310 corresponds to second absorption layer 206 (FIG. 2) and illustrates a sensitivity to radiation in a second wavelength band.

Given that curves 302 and 304 are further apart in section 306 than in section 310, first wavelength band corresponds to higher energy levels and shorter wavelengths than second wavelength band. Section 308, which corresponds to barrier layer 204, illustrates that barrier layer 204 acts as an insulator, preventing electrons from traveling between first absorption layer 202 and second absorption layer 206. Section 312 of curve 304 illustrates that gradient 214 of barrier layer 214 provides a gradual transition between the energy levels associated with first absorption layer 202 (i.e., section 306 of FIG. 3), and second absorption layer 206 (i.e., section 310 of FIG. 3). If barrier layer 204 was instead made of a uniform alloy, section 312 would not include a gradual transition, but rather would include a gap between the energy levels of curve 304 at section 310 and the energy levels of curve 304 at section 306, due to a valence band edge mismatch between barrier layer 204 and at least one of first absorption layer 202 and second absorption layer 206.

Figure 4:
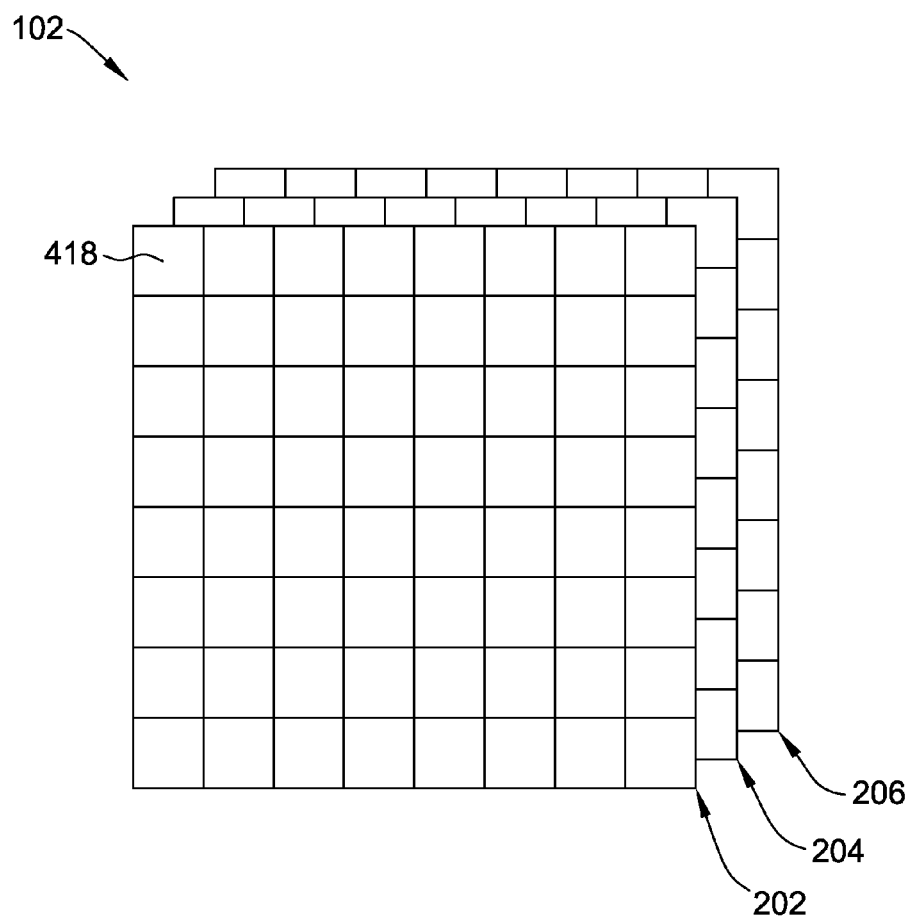
FIG. 4 is a perspective view of a first absorption layer, a barrier layer, and a second absorption layer of the dual-band infrared detector of FIG. 1.

FIG. 4 is a perspective view of first absorption layer 202, barrier layer 204, and second absorption layer 206 of dual-band infrared detector 102. Each of first absorption layer 202, barrier layer 204, and second absorption layer 206 is etched to form discrete detection sections 418. An electrical signal from each detection section 418 is transmitted to readout chip 210 (FIG. 2). In some implementations, readout chip 210 then transmits corresponding infrared detection data to computing device 112 via connection 114, for example as pixel values. More specifically, in some implementations, readout chip 210 applies a first bias voltage having a first magnitude and a first polarity to first absorption layer 202 and collects infrared data corresponding to a first wavelength band. Next, readout chip 210 applies a second bias voltage having a second magnitude a second polarity that is the opposite of the first polarity to the second absorption layer 206 and collects infrared data corresponding to a second wavelength band. The infrared data collected by readout chip 210 may initially be in the form of an analog value, representing for example an energy value or an electrical current value, associated with each detection section 418.

In some implementations, readout chip 210 converts the infrared data before transmitting it to computing device 112. For example, readout chip 210, in some implementations, converts each analog value to a digital value. In some embodiments, readout chip 210 transmits a first greyscale image to computing device 112, wherein the greyscale image comprises pixels having values corresponding to infrared detection data for the first wavelength band, and transmits a second greyscale image to computing device 112, wherein the second greyscale image comprises pixels having values corresponding to infrared detection data for the second wavelength band. In other implementations, readout chip 210 transmits a single image comprising two bands of values for each pixel, wherein the two bands correspond to the first wavelength band and the second wavelength band.

Figure 5:
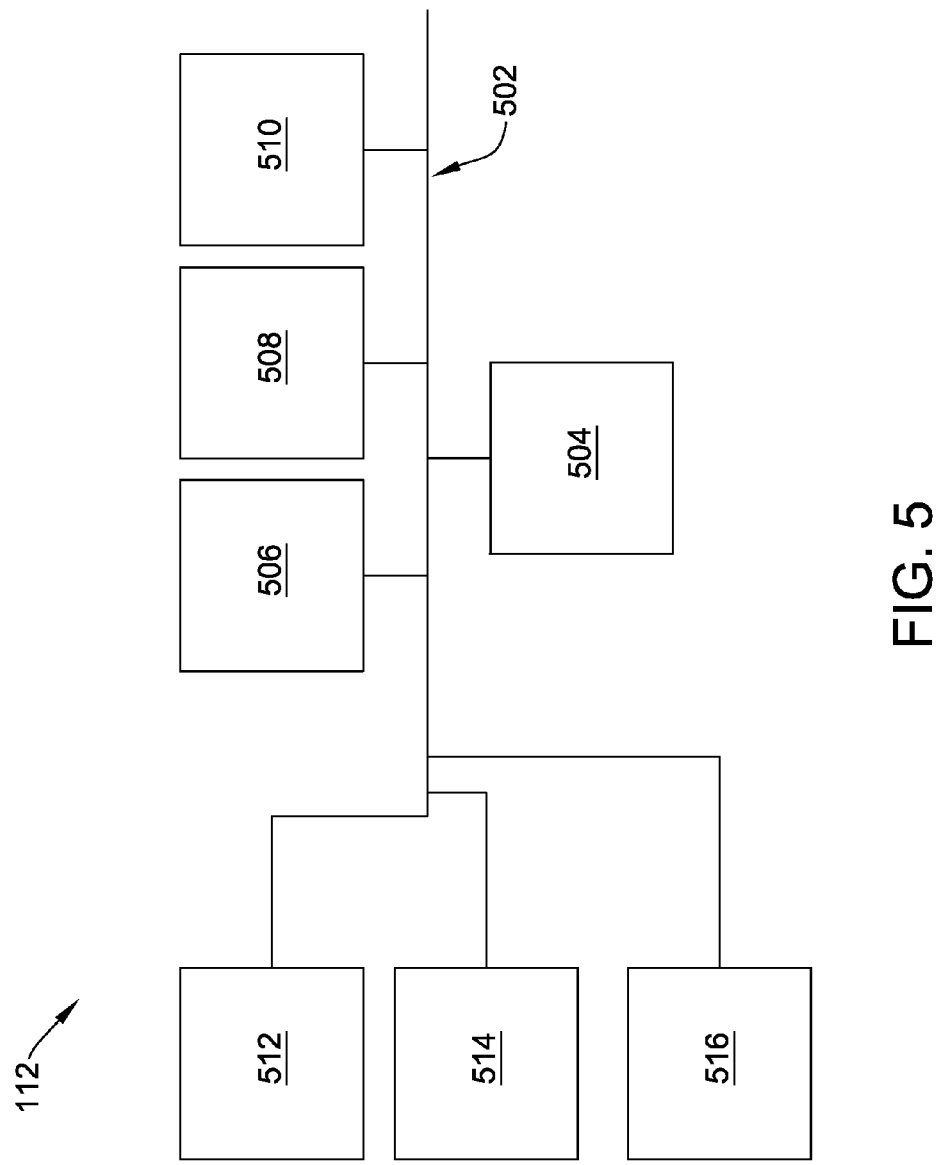
FIG. 5 is a schematic diagram of computing device that may be used with the dual-band infrared detector of FIG. 1.

FIG. 5 is a schematic diagram of computing device 112. Computing device 112 may include a bus 502, a processor 504, a main memory 506, a read only memory (ROM) 508, a storage device 510, an input device 512, an output device 514, and a communication interface 516. Bus 502 may include a path that permits communication among the components of computing device 500.

Processor 504 may include any type of conventional processor, microprocessor, or processing logic that interprets and executes instructions. Main memory 506 may include a random access memory (RAM) or another type of dynamic storage device that stores information and instructions for execution by processor 504. ROM 508 may include a conventional ROM device or another type of static storage device that stores static information and instructions for use by processor 504. Storage device 510 may include a magnetic and/or optical recording medium and its corresponding drive.

Input device 512 may include a conventional mechanism that permits computing device 112 to receive commands, instructions, or other inputs from a user, including visual, audio, touch, button presses, stylus taps, etc. Additionally, input device may receive location information. Accordingly, input device 512 may include, for example, a camera, a microphone, one or more buttons, a touch screen, and/or a GPS receiver. Output device 514 may include a conventional mechanism that outputs information to the user, including a display (including a touch screen) and/or a speaker. Communication interface 516 may include any transceiver-like mechanism that enables computing device 112 to communicate with other devices and/or systems. For example, communication interface 516 may include mechanisms for communicating with another device, such as dual-band infrared detector 102 and/or other devices (not shown).

As described herein, computing device 112 facilitates processing of infrared detection data, such as image processing, for example filtering and/or object recognition, and other functions such as storage and/or transmission of data to one or more additional computing devices (not shown). Computing device 112 may perform these and other operations in response to processor 504 executing software instructions contained in a computer-readable medium, such as memory 506. A computer-readable medium may be defined as a physical or logical memory device and/or carrier wave. The software instructions may be read into memory 506 from another computer-readable medium, such as data storage device 510, or from another device via communication interface 516. The software instructions contained in memory 506 may cause processor 504 to perform processes described herein. In other implementations, hardwired circuitry may be used in place of or in combination with software instructions to implement processes consistent with the subject matter herein. Thus, implementations consistent with the principles of the subject matter disclosed herein are not limited to any specific combination of hardware circuitry and software.

Figure 6:
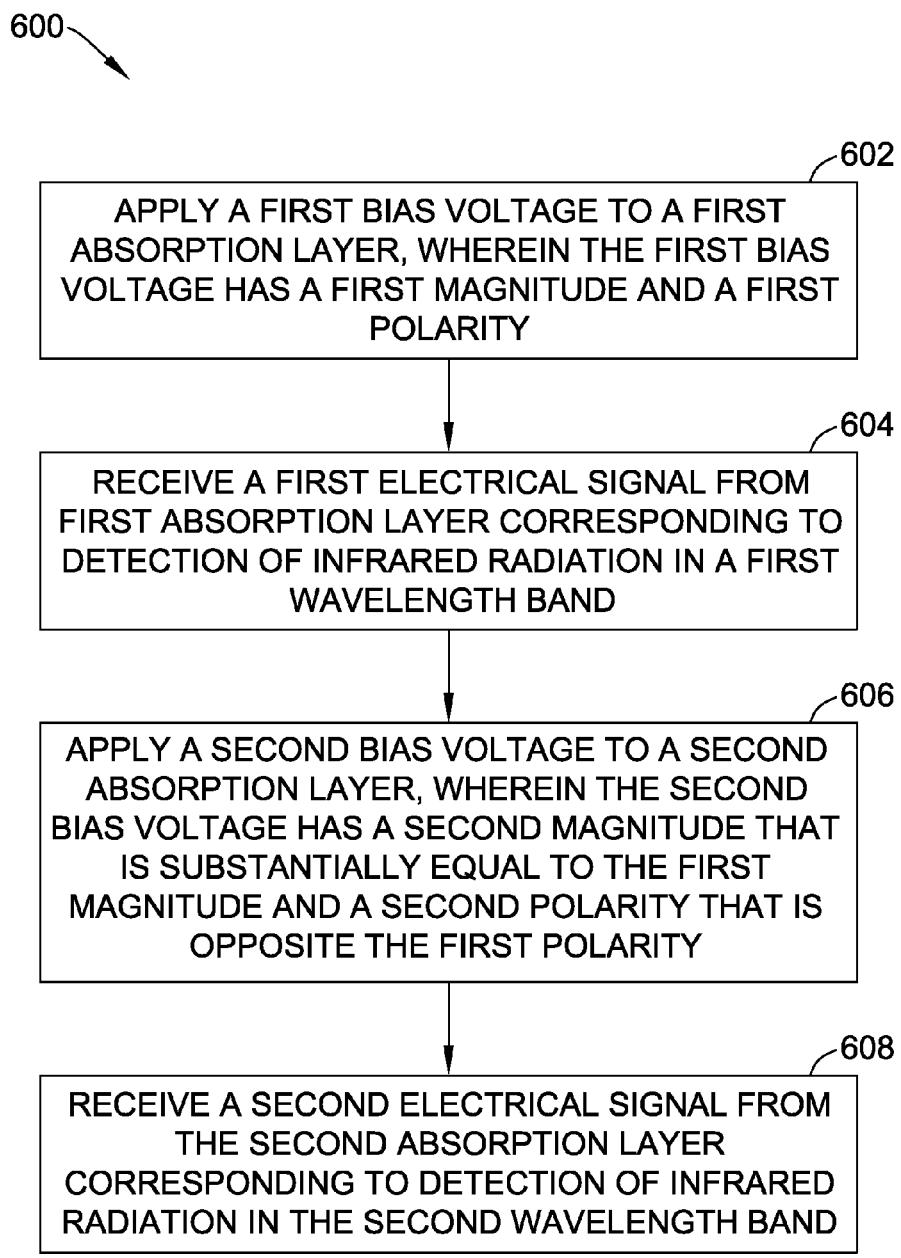
FIG. 6 is a flowchart of a method that may be implemented by the dual-band infrared detector of FIG. 1 for detecting infrared radiation in two wavelength bands.

FIG. 6 is a flowchart of a method 600 for detecting infrared radiation in two wavelength bands. Method 600 may be implemented by dual-band infrared detector 102 (FIG. 1). Dual-band infrared detector 102 applies 602 a first bias voltage to first absorption layer 202. The first bias voltage has a first magnitude, for example 200 millivolts, and first polarity, for example positive. Next, dual-band infrared detector 102 receives 604 a first electrical signal from first absorption layer 202 corresponding to detection of infrared radiation in a first wavelength band. For example, the first wavelength band may include wavelengths in a range of wavelengths corresponding to short-wavelength infrared (SWIR) and/or wavelengths in a range of wavelengths corresponding to mid-wavelength infrared (MWIR). The first electrical signal may be, for example, electrical current. In implementations wherein first absorption layer 202 includes multiple discrete detection sections 418, the first electrical signal is a plurality of electrical signals, each corresponding to one of multiple detection sections 418.

Next, dual-band infrared detector 102 applies 606 a second bias voltage to a second absorption layer, wherein the second bias voltage has a second magnitude that is substantially equal to the first magnitude and a second polarity that is opposite the first polarity. For example, dual-band infrared detector 102 applies a second voltage of −200 millivolts to second absorption layer 206. Next, dual-band infrared detector 102 receives 608 a second electrical signal from second absorption layer 206 corresponding to detection of infrared radiation in the second wavelength band. For example, the second wavelength band may include wavelengths in a range of wavelengths corresponding to mid-wavelength infrared (MWIR) and/or wavelengths in a range corresponding to long-wavelength infrared (LWIR). The second electrical signal, may be, for example, electrical current. In implementations wherein second absorption layer 206 includes multiple discrete detection sections 418, the second electrical signal is a plurality of electrical signals, each corresponding to one of multiple detection sections 418.

A technical effect of systems and methods described herein includes at least one of: (a) applying a first bias voltage to a first absorption layer, wherein the first bias voltage has a first magnitude and a first polarity; (b) receiving a first electrical signal from the first absorption layer corresponding to detection of infrared radiation in a first wavelength band; (c) applying a second bias voltage to a second absorption layer, wherein the second bias voltage has a second magnitude that is substantially equal to the first magnitude and a second polarity that is opposite the first polarity; and (d) receiving a second electrical signal from the second absorption layer corresponding to detection of infrared radiation in the second wavelength band.

As compared to known methods and systems for detecting infrared radiation in a single band, the methods and systems described herein facilitate detecting infrared radiation in two bands and reducing an amount of bias voltage applied to each of two absorption layers in a dual-band infrared detector.

The description of the different advantageous implementations has been presented for purposes of illustration and description, and is not intended to be exhaustive or limited to the implementations in the form disclosed. Many modifications and variations will be apparent to those of ordinary skill in the art. Further, different advantageous implementations may provide different advantages as compared to other advantageous implementations. The implementation or implementations selected are chosen and described in order to best explain the principles of the implementations, the practical application, and to enable others of ordinary skill in the art to understand the disclosure for various implementations with various modifications as are suited to the particular use contemplated. This written description uses examples to disclose various implementations, which include the best mode, to enable any person skilled in the art to practice those implementations, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A dual-band infrared detector comprising:
    a first absorption layer, wherein said first absorption layer is sensitive to only a first infrared wavelength band;
    a barrier layer coupled to said first absorption layer, said barrier layer includes a first section that is coupled to the first absorption layer and includes a first amount of Gallium, a second section that is opposite said first absorption layer and includes a second amount of Gallium that is different from the first amount of Gallium, and a gradient between the first amount of Gallium in said first section and the second amount of Gallium in said second section; and
    a second absorption layer coupled to said second section of said barrier layer, wherein said second absorption layer is sensitive to only a second infrared wavelength band that is different from the first infrared wavelength band, wherein said infrared detector is capable of detecting the first wavelength band and the second wavelength band by applying a first bias voltage of a first polarity to said first absorption layer and by applying a second bias voltage of a second polarity that is opposite the first polarity to said second absorption layer, wherein the first bias voltage and the second bias voltage each have a magnitude of less than about or equal to 500 mV.

2. The dual-band infrared detector of claim 1, wherein said infrared detector is capable of detecting the first wavelength band and the second wavelength band when the first bias voltage and the second bias voltage each have a magnitude that is less than or equal to 200 mV.

3. The dual-band infrared detector of claim 1, wherein said first absorption layer is sensitive to wavelengths between three and five micrometers.

4. The dual-band infrared detector of claim 1, wherein said second absorption layer is sensitive to wavelengths between eight and twelve micrometers.

5. The dual-band infrared detector of claim 1, wherein said first absorption layer and said second absorption layer each comprise Indium, Arsenic, and Antimony.

6. The dual-band infrared detector of claim 1, wherein said barrier layer comprises one of AlGaSb and AlAsSb.

7. The dual-band infrared detector of claim 1, wherein said barrier layer comprises Aluminum, Antimony, and at least one of Gallium and Arsenic.

8. The dual-band infrared detector of claim 1, wherein said barrier layer comprises a graded-composition ternary or quaternary AlSb-based alloy.

9. The dual-band infrared detector of claim 1, wherein each of said first layer and said second layer further comprise a plurality of discrete detection sections.

10. The dual-band infrared detector of claim 1, wherein said first absorption layer further comprises a first valence band edge, said second absorption layer further comprises a second valence band edge, and
    said first section of said barrier layer is aligned with said first valence band edge of said first absorption layer; and
    said second section of said barrier layer is aligned with said second valence band edge of said second absorption layer.

11. The dual-band infrared detector of claim 5, wherein said first absorption layer comprises $InAs_{0.82}Sb_{0.18}$.

12. The dual-band infrared detector of claim 5, wherein said second absorption layer comprises $InAs_{0.91}Sb_{0.09}$.

13. The dual-band infrared detector of claim 1, wherein said dual-band infrared detector is configured to apply the first bias voltage, then apply the second bias voltage, wherein the first bias voltage and the second bias voltage are less than 100 mV.

14. An imaging system comprising:
    a computing device; and
    a dual-band infrared detector that is communicatively coupled to said computing device, wherein said dual-band infrared detector comprises:
    a first absorption layer, wherein the first absorption layer includes a first valence band edge and is sensitive to only a first infrared wavelength band;

a second absorption layer, wherein said second absorption layer includes a second valence band edge and is sensitive to only a second infrared wavelength band that is different from the first infrared wavelength band;

a barrier layer comprising a first section that is coupled to said first absorption layer and includes a first amount of Gallium, wherein said first section is aligned with said first valence band edge of said first absorption layer and a second section that is coupled to said second absorption layer and includes a second amount of Gallium that is different from the first amount of Gallium, wherein said second section is aligned with said second valence band edge of said second absorption layer, and a gradient between the first amount of Gallium in said first section and the second amount of Gallium in said second section;

an interface layer coupled to one of said first absorption layer and said second absorption layer; and a readout chip coupled to said interface layer and electrically coupled to said first absorption layer and said second absorption layer.

15. The imaging system of claim 14, wherein each of said first layer and said second layer further comprise a plurality of discrete detection sections.

16. The imaging system of claim 14, wherein said barrier layer comprises Aluminum, Antimony, and at least one of Gallium and Arsenic.

17. The imaging system of claim 14, wherein said dual-band infrared detector is configured to:

apply a first bias voltage to said first absorption layer, wherein the first bias voltage has a first magnitude and a first polarity;

receive a first electrical signal from said first absorption layer corresponding to detection of infrared radiation in the first wavelength band;

apply a second bias voltage to said second absorption layer, wherein said second bias voltage has a second magnitude that is equal to the first magnitude and a second polarity that is opposite the first polarity; and receive a second electrical signal from said second absorption layer corresponding to detection of infrared radiation in the second wavelength band.

18. The imaging system of claim 17, wherein said dual-band infrared detector is further configured to:

convert the first electrical signal into first infrared detection data;

convert the second electrical signal into second infrared detection data; and transmit the first infrared detection data and the second infrared detection data to said computing device.

19. A method for detecting two bands of infrared radiation using a dual-band infrared detector comprising:

a first absorption layer, wherein the first absorption layer is sensitive to only a first infrared wavelength band;

a barrier layer coupled to the first absorption layer;

a second absorption layer coupled to the barrier layer, wherein the second absorption layer is sensitive to only a second infrared wavelength band that is different from the first infrared wavelength band;

an interface layer coupled to one of the first absorption layer and the second absorption layer; and a readout chip coupled to the interface layer and electrically coupled to the first absorption layer and the second absorption layer;

said method comprising:

applying a first bias voltage to the first absorption layer that is coupled to a first section of the barrier layer, wherein the first section includes a first amount of Gallium, wherein the first bias voltage has a first magnitude and a first polarity;

receiving a first electrical signal from the first absorption layer corresponding to detection of infrared radiation in the first wavelength band;

applying a second bias voltage to the second absorption layer that is coupled to a second section of the barrier layer, wherein the second section includes a second amount of Gallium that is different from the first amount of Gallium, wherein the second bias voltage has a second magnitude that is substantially equal to the first magnitude and a second polarity that is opposite the first polarity, and the barrier layer includes a gradient between the first amount of Gallium in the first section and the second amount of Gallium in the second section; and receiving a second electrical signal from the second absorption layer corresponding to detection of infrared radiation in the second wavelength band.

20. The method of claim 19, wherein the dual-band infrared detector is communicatively coupled to a computing device, said method further comprising:

converting the first electrical signal into first infrared detection data;

converting the second electrical signal into second infrared detection data; and transmitting the first infrared detection data and the second infrared detection data to the computing device.

* * * * *